US008492206B2

(12) United States Patent
Zhong et al.

(10) Patent No.: US 8,492,206 B2
(45) Date of Patent: Jul. 23, 2013

(54) SEMICONDUCTOR DEVICE STRUCTURE AND METHOD FOR MANUFACTURING THE SAME

(75) Inventors: Huicai Zhong, San Jose, CA (US); Jun Luo, Beijing (CN); Qingqing Liang, Lagrangeville, NY (US); Huilong Zhu, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 0 days.

(21) Appl. No.: 13/375,692

(22) PCT Filed: Aug. 29, 2011

(86) PCT No.: PCT/CN2011/079040
§ 371 (c)(1),
(2), (4) Date: Dec. 1, 2011

(87) PCT Pub. No.: WO2013/026213
PCT Pub. Date: Feb. 28, 2013

(65) Prior Publication Data
US 2013/0049125 A1    Feb. 28, 2013

(30) Foreign Application Priority Data

Aug. 22, 2011  (CN) .......................... 2011 1 0240932

(51) Int. Cl.
*H01L 21/335*       (2006.01)
*H01L 21/70*        (2006.01)
(52) U.S. Cl.
USPC  438/142; 257/499; 257/E21.54; 257/E47.001

(58) Field of Classification Search
CPC ..... H01L 29/785; H01L 29/517; H01L 27/517; H01L 27/0207; H01L 2924/3011; H01L 2924/14
USPC .................. 257/327, 499, E47.001, E21.54; 438/142, 197, 400, 424
See application file for complete search history.

(56) References Cited

U.S. PATENT DOCUMENTS

| 6,764,884 B1 | 7/2004 | Yu et al. |
| 7,655,989 B2 | 2/2010 | Zhu et al. |

(Continued)

FOREIGN PATENT DOCUMENTS

| CN | 101192605 A | 6/2008 |
| CN | 100413039 C | 8/2008 |

(Continued)

OTHER PUBLICATIONS

International Application Serial No. PCT/CN2011/079040, International Search Report mailed May 31, 2012, 5 pgs.

(Continued)

*Primary Examiner* — Nikolay Yushin
(74) *Attorney, Agent, or Firm* — Schwegman Lundberg & Woessner, P.A.

(57) ABSTRACT

A semiconductor device structure and a method for manufacturing the same are disclosed. In one embodiment, the method comprises: forming a fin in a first direction on a semiconductor substrate; forming a gate line in a second direction crossing the first direction on the semiconductor substrate, the gate line intersecting the fin via a gate dielectric layer; forming a dielectric spacer surrounding the gate line; forming a conductive spacer surrounding the dielectric spacer; and performing inter-device electrical isolation at a predetermined region, wherein isolated portions of the gate line form gate electrodes of respective unit devices, and isolated portions of the conductive spacer form contacts of the respective unit devices.

17 Claims, 14 Drawing Sheets

U.S. PATENT DOCUMENTS

| | | |
|---|---|---|
| 7,923,784 B2 | 4/2011 | Chae |
| 2009/0101968 A1* | 4/2009 | Sugioka .................. 257/327 |
| 2010/0041198 A1 | 2/2010 | Zhu et al. |
| 2011/0049613 A1 | 3/2011 | Yeh et al. |

FOREIGN PATENT DOCUMENTS

| | | |
|---|---|---|
| CN | 101930980 A | 12/2010 |
| CN | 102005477 A | 4/2011 |

OTHER PUBLICATIONS

International Application Serial No, PCT/CN2011/079040, Written Opinion mailed May 31, 2012, 4 pgs.

* cited by examiner

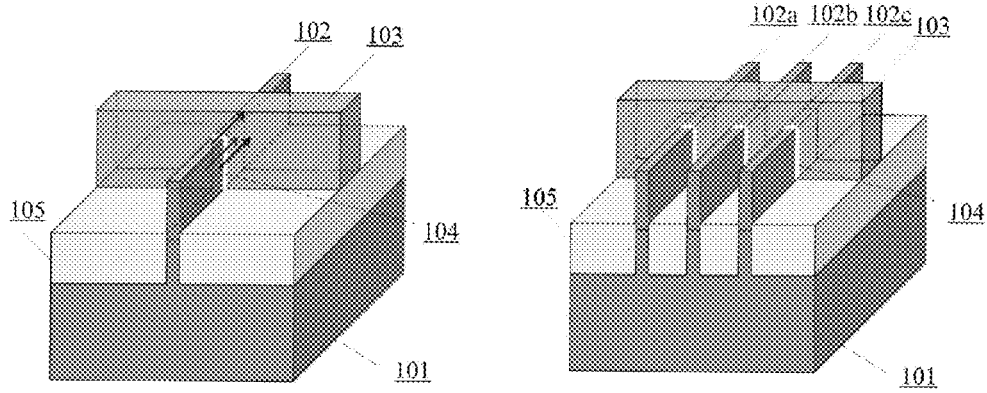
FIG. 1A
(PRIOR ART)
FIG. 1B
(PRIOR ART)
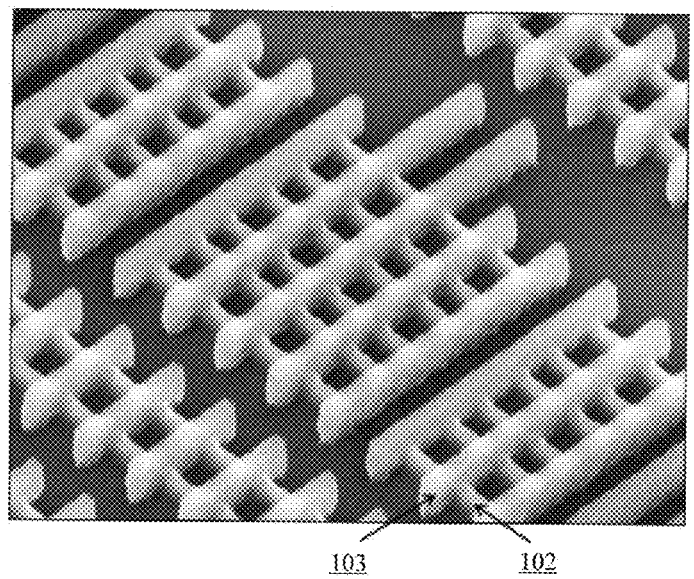
FIG. 2

SEMICONDUCTOR DEVICE STRUCTURE AND METHOD FOR MANUFACTURING THE SAME

CROSS-REFERENCE TO RELATED APPLICATIONS

This application is a U.S. National Stage Filing under 35 U.S.C. §371 of International Application No. PCT/CN2011/079040, filed on Aug. 29, 2011 and published as WO 2013/02612 A1, on Feb. 28, 2013, which claims priority under 35 U.S.C. §119 to Chinese Application No. 201110240932.X, filed on Aug. 22, 2011, which applications and publications are incorporated herein by reference in their entirety.

TECHNICAL FIELD

The present disclosure relates to the semiconductor field, and more particularly, to a semiconductor device structure having a fin and a method for manufacturing the same, where a gate pattern can be formed with a high quality.

BACKGROUND

As the integration density is continuously increasing, fin transistor structures such as Fin Field Effect Transistors (Fin-FETs) are attracting more attentions due to their good electrical characteristics, scalability and compatibility with the conventional manufacture processes. FIG. 1(a) is a perspective view showing a FinFET by way of example. As shown in FIG. 1(a), the FinFET comprises: a bulk Si semiconductor substrate 101; a fin formed on the bulk Si semiconductor substrate 101; a gate electrode 103 intersecting the fin 102, with a gate dielectric layer 104 disposed therebetween; and an isolation region 105 (for example, $SiO_2$). In this FinFET, conductive channels will be created in the fin 102, specifically, in three side walls of the fin 102 (i.e., the left and right side walls and the top wall shown in the figure) under control of the gate electrode 103, as shown by arrows in FIG. 1(a). That is, portions of the fin 102 underlying the gate electrode 103 serve as a channel region, and source and drain regions are located on opposite sides of the channel region.

In the example shown in FIG. 1(a), the FinFET is formed on the bulk semiconductor substrate. However, a FinFET can also be formed on a substrate in other forms such as a Semi-conductor On Insulator (SOI) substrate. Further, the FET shown in FIG. 1(a) is termed as a tri-gate FET because the three side walls of the fin 102 all can have the channels created therein. For example, a 2-gate FET can be formed by disposing an isolation layer (for example, nitride) between the top wall of the fin 102 and the gate electrode 103, in which case there is no channel created in the top wall of the fin 102.

Furthermore, in order to improve the driving capability so as to further improve the performance, it is possible to connect several fins together to form one same device. Referring to FIG. 1(b), three fins 102a, 102b and 102c are controlled by one gate electrode 103, and they may be connected to one source and one drain (not shown in the figure). As a result, the FinFET shown in FIG. 1(b) has a significantly improved driving capability. Other reference numerals shown in FIG. 1(b) are same as those corresponding ones shown in FIG. 1(a). FIG. 2 is a photo showing a profile of fins 102 and gate electrodes 103 in an actual FinFET.

However, as device feature sizes are becoming smaller continuously, it is more difficult to make gate electrodes for the fin transistors. On the other hand, conventionally contacts on the gate electrodes and contacts on source and drain regions are formed by etching contact holes and then filling conductive material(s) such as metal therein. Such a process of making the contacts becomes even more difficult in the fin transistors.

In view of the above, there is a need for a semiconductor device structure having a fin and a method for manufacturing the same.

SUMMARY

The present disclosure provides, among other things, a semiconductor device structure and a method for manufacturing the same, to overcome the problems in the conventional processes as described above.

According to an embodiment, there is provided a method for manufacturing a semiconductor device structure, comprising: forming a fin in a first direction on a semiconductor substrate; forming a gate line in a second direction crossing the first direction on the semiconductor substrate, the gate line intersecting the fin via a gate dielectric layer; forming a dielectric spacer surrounding the gate line; forming a conductive spacer surrounding the dielectric spacer; and performing inter-device electrical isolation at a predetermined region, wherein isolated portions of the gate line form gate electrodes of respective unit devices, and isolated portions of the conductive spacer form contacts of the respective unit devices.

According to a further embodiment, there is provided a semiconductor device structure, comprising: a semiconductor substrate; and a plurality of unit devices formed on the semiconductor substrate. Each of the unit devices may comprise: a fin extending in a first direction; a gate electrode extending in a second direction crossing the first direction, the gate electrode intersecting the fin via a gate dielectric layer; dielectric spacers formed on outer sides of the gate electrode; and conductive spacers formed on outer sides of the dielectric spacers, the conductive spacers serving as contacts for the unit device. Here, gate electrodes, dielectric spacers and conductive spacers of respective unit devices adjacent to each other in the second direction may be made from one gate line, one dielectric spacer, and one conductive spacer, respectively. The gate line comprises a first electrical isolation at a predetermined region between the adjacent unit devices, and the conductive spacer comprises a second electrical isolation at the predetermined region between the adjacent unit devices. The dielectric spacer only extends along the outer sides of the gate line.

In the present disclosure, the inter-device electrical isolation, for example, cutting or oxidation, is made after the formation of the dielectric spacer and the conductive spacer. Therefore, the dielectric spacers and the conductive spacers will not extend into opposing end faces of respective gate electrodes of adjacent unit devices. Thus, unlike the conventional processes, there will be no defects such as voids due to the presence of the spacer materials in the cuts. As a result, the minimum electrical isolation space between the devices can be reduced, and thus the integration density of the devices can be improved, resulting in reduced manufacture cost.

Unlike the conventional processes where contacts are formed by etching contact holes and then filling conductive material(s) in the contact holes, the contacts according to the embodiments of the present disclosure are manufactured as spacers, thereby eliminating the difficulty in forming the contact holes in the conventional processes. Further, since the contacts according to the embodiments of the present disclosure are manufactured as spacers on the outer sides of the respective dielectric spacers, they are self-aligned to the source/drain regions and therefore can serve as contacts for electrical connections between the source/drain regions of the semiconductor device and the outside.

Further, in the present disclosure, the conductive spacers (that is, the lower contacts) and the gate stacks may be made to the same height by planarization. This facilitates the subsequent processes such as electrical connection.

BRIEF DESCRIPTION OF THE DRAWINGS

The above and other objects, features, and advantages of the present disclosure will become apparent from following descriptions of embodiments with reference to the attached drawings, in which:

FIG. 1 shows perspective views of FinFETs by way of example;

FIG. 2 is a photo showing a profile of fins and gate electrodes in an actual FinFET;

DETAILED DESCRIPTION

Figure 3A:
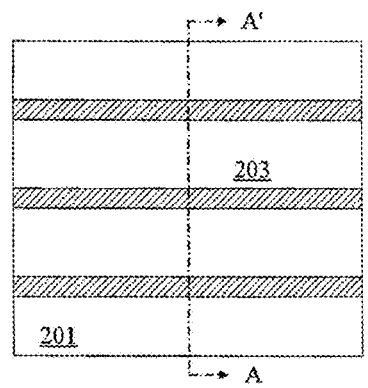
FIG. 3 is a diagram schematically showing a conventional process for making a fin for a FinFET, wherein (a) is a top view, and (b) is a sectional view taken along line A-A' in (a)

Hereinafter, descriptions are given with reference to embodiments shown in the attached drawings. However, it is to be understood that these descriptions are illustrative and not intended to limit the present disclosure. Further, in the following, well-known structures and technologies are not described to avoid obscuring the present disclosure unnecessarily.

In the drawings, various structures according to the embodiments are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

First, a conventional process for making gate stacks for a FinFET device is described in brief.

Figure 3B:
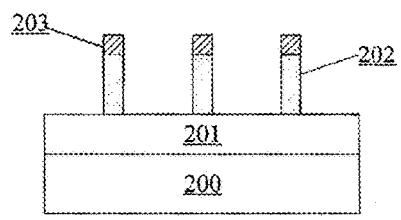

As shown in FIG. 3, first fins are formed on a semiconductor substrate. In the example shown in FIG. 3, the semiconductor substrate is a SOI substrate, including two Si layers 200 and 202 and a SiO$_2$ layer 201 interposed therebetween. The Si layer 202 is etched through a patterned hard mask layer 203 (for example, Si$_3$N$_4$) serving as a mask, to form the fins.

In this example, the semiconductor substrate comprises Si and the fins are also made of the semiconductor material Si. However, those skilled in the art will understand that the semiconductor substrate and/or the fins may comprise any suitable semiconductor material, such as Ge, GaN, InP, and the like. In the following, the descriptions are given also in conjunction with a SOI substrate by way of example, but the present invention is not limited thereto.

The hard mask layer 203 may be removed. Thus, a gate electrode, which will be made subsequently, will be coupled to three side walls of a respective one of the fins 202 via a gate dielectric layer, resulting in a tri-gate FET. Or alternatively, the hard mask layer 203 may be reserved, so that a gate electrode, which will be made subsequently, will be coupled to only two side walls of a respective one of the fins 202 via a gate dielectric layer (the top side wall thereof will not have a channel created therein under control of the gate electrode due to the presence of the hard mask layer 203), resulting in a 2-gate FET.

Hereinafter, the descriptions are given also in conjunction with a tri-gate FET by way of example. However, those skilled in the art will appreciate that the present disclosure is also applicable to a 2-gate FET as well as other semiconductor device structure having a fin.

Figure 4:
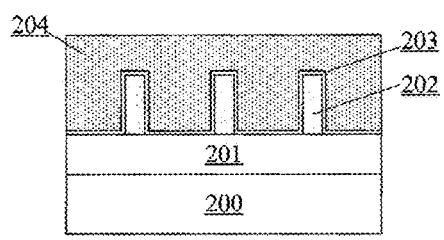
FIG. 4 is a diagram schematically showing a structure formed after forming a gate dielectric layer and a gate electrode layer on the structure shown in FIG. 3.

Next, as shown in FIG. 4, a gate dielectric layer 203 (for example, a high-K gate dielectric layer) and a gate electrode layer 204 (for example, a metal gate electrode layer) are formed sequentially on the semiconductor substrate having the fins formed thereon. Then, the gate dielectric layer 203 and the gate electrode layer 204 are patterned to form the final gate stacks.

Figure 5A:
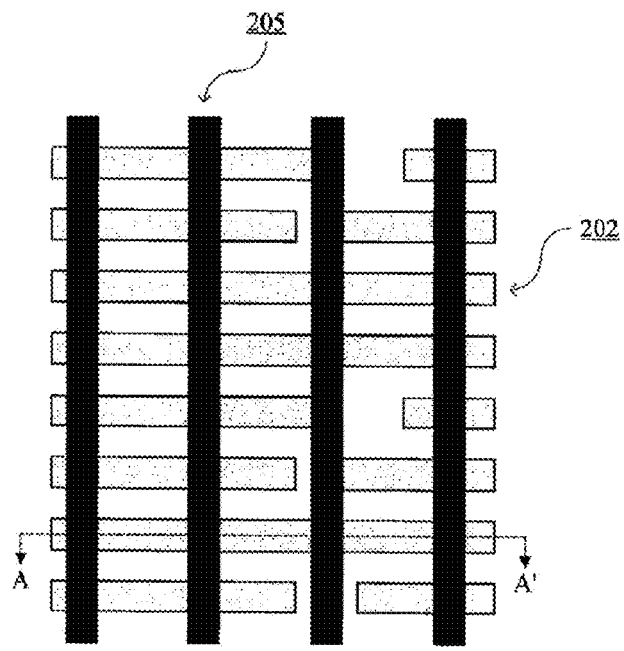
FIGS. 5-7 are diagrams schematically showing a conventional process for pattering gate stacks for a FinFET device, wherein (a) is a top view, (b) is a sectional view taken along line A-A' in (a)

Specifically, as shown in FIG. 5(a), the semiconductor substrate is shown in a top view. The semiconductor substrate has a pattern of the fins 202 formed thereon, as shown in FIG. 4. Here, it is to be noted that FIG. 4 only shows a portion of the structure shown in FIG. 5(a) and thus appears different from FIG. 5(a). Further, the semiconductor substrate also have the gate dielectric layer 203 and the gate electrode layer 204 formed thereon. However, for sake of clarity, the gate dielectric layer 203 and the gate electrode layer 204 are not shown in the top view (this is also true for the following top views). In this structure, a pattern of photo resist lines 205, corresponding to a pattern of gate lines to be formed, is printed by coating a photo resist layer, exposing the resist through a mask, and then developing the resist. The respective lines of the pattern 205 are printed in parallel in a single direction, and have same or similar pitches and critical dimensions.

Figure 5B:
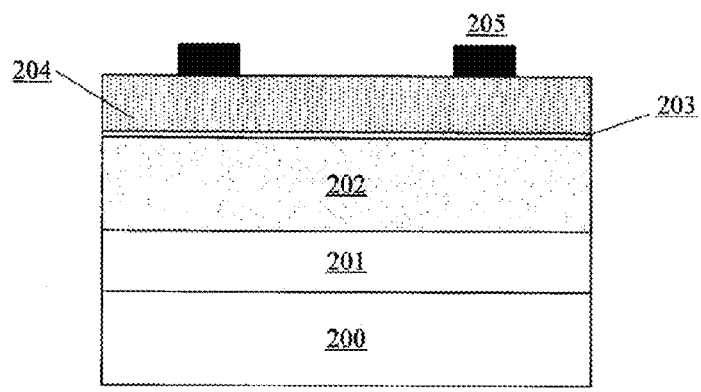

In FIG. 5(b), only two lines 205 in the sectional view along line A-A' are shown for sake of clarity. This is also true for the following sectional views.

Figure 6A:
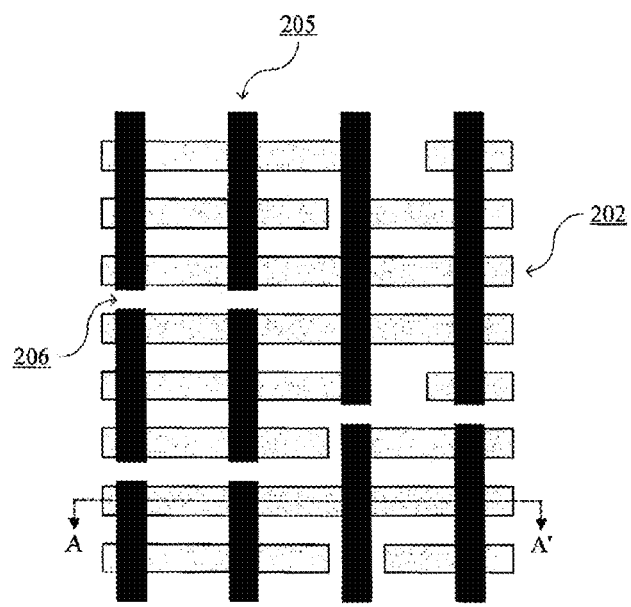
Figure 6B:
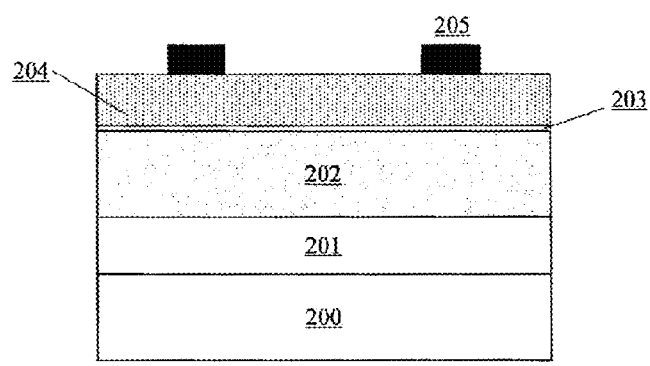

Next, as shown in FIG. 6, cuts 206 are formed in the pattern of lines 205 by a further exposure through a cut mask and then development. Thus, in the pattern 205, gate patterns corresponding to different unit devices are separated from one another.

Figure 7A:
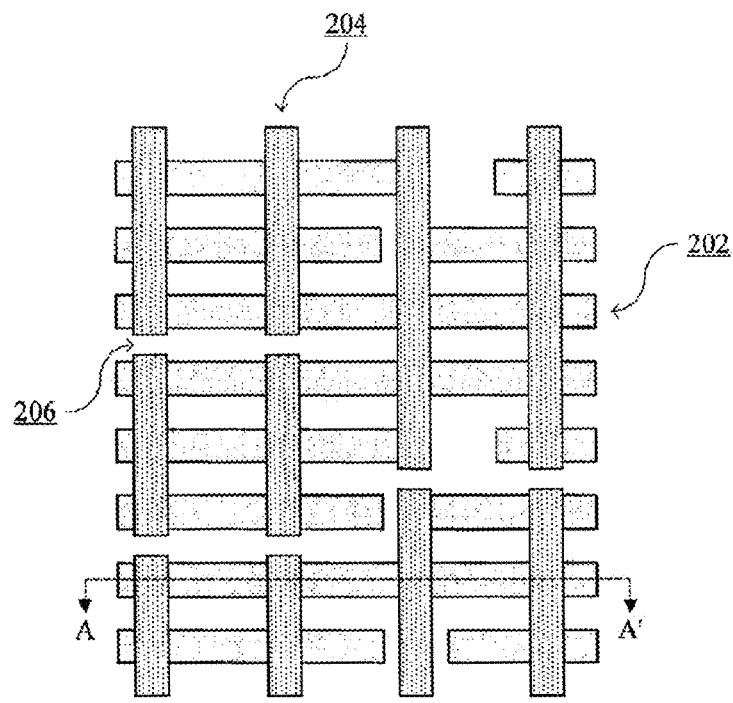
Figure 7B:
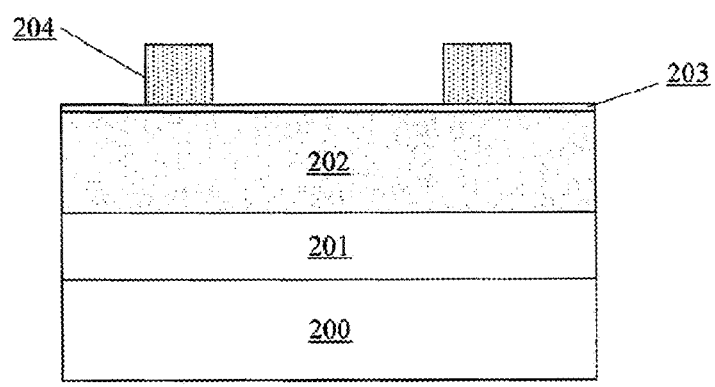

Finally, etching is carried out with the photo resist pattern 205 having the cuts 206 formed therein to achieve gate stacks corresponding to this pattern. FIG. 7 shows gate electrodes 204 formed by the etching. Here, it is to be noted that in the example shown in FIG. 7 the gate dielectric layer 203 has not been etched. However, those skilled in the art will understand that the gate dielectric layer 203 can be also etched following the etching of the gate electrode layer 204.

Alternatively, a first etching can be carried out after the pattern of lines 205 is printed as shown in FIG. 5, to form parallel gate lines; and then, a second etching can be carried out using the cut mask, to form cuts in the parallel gate lines.

In the above process, a single exposure for forming the gate patterns is divided into two: one for exposing the pattern of lines 205, and the other for exposing the cuts 206. As a result, it is possible to reduce the demand for the photolithography and improve the line width control in the photolithography. Further, it is possible to eliminate many proximity effects.

Figure 8:
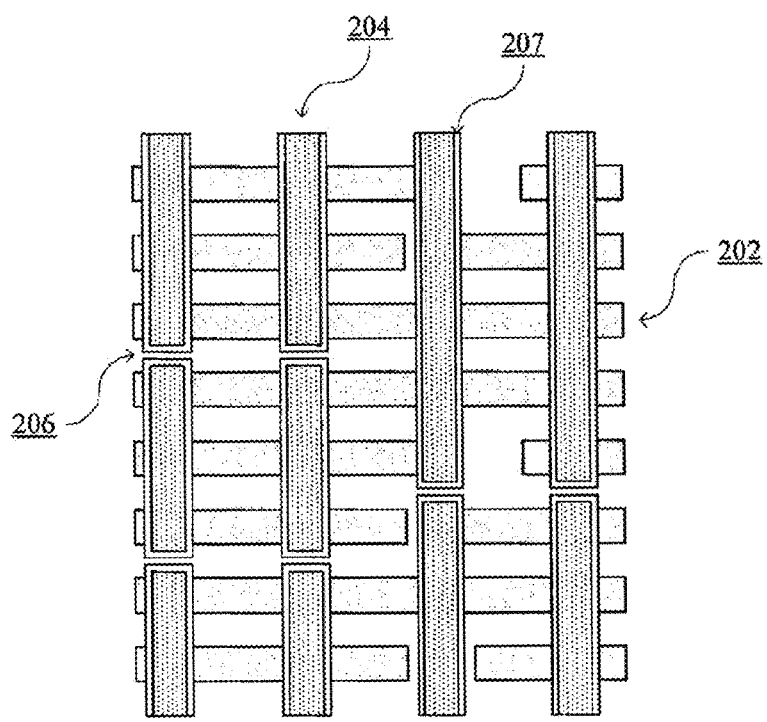
FIG. 8 is a diagram schematically showing a gate electrode and a gate spacer surrounding the gate electrode as a result of the conventional process.

However, with the continuously decreasing of the device feature sizes, the above conventional process is encountering more and more challenges. According to the conventional process, after the cuts are formed, processes such as dielectric spacer formation should be conducted. Referring to FIG. 8, dielectric spacers 207 surrounding the respective gate electrodes 204 are shown. In FIG. 8, for sake of simplification, no spacer is shown at the uppermost and lowermost sides. However, it is to be noted that there are also spacers 207 formed at those positions if some gate electrodes 204 terminate at those positions. In one word, the spacers 207 surround the respective gate electrodes 204. Since there are the cuts 206 in the gate patterns, the material of the spacers will enter inside the cuts 206. As a result, the cuts in the gate lines will impact the profile of the dielectric spacers. For example, if the cuts in the gate lines are very small (that is, a distance between opposing end faces of two opposing gate electrodes is very small), there may be voids formed in the dielectric at positions of the cuts. Those voids will cause defects such as shorts in subsequent processes. Further, the profile of the dielectric spacer material at the positions of the cuts will also significantly impact a subsequent CMP process.

Therefore, the conventional process requires highly precise end to end gaps (between gate electrodes). However, such a requirement makes the Optical Proximity Correction (OPC) become more difficult. Further, designs for the cut mask become more challenging. Especially, in recent years the replacement gate process is adopted to use a high-K gate dielectric/metal gate configuration. The replacement gate process makes the line-and-cut method even more complicated.

In addition, according to the conventional processes, contacts to gates and sources/drains are formed by forming an interlayer dielectric layer, etching contact holes in the interlayer dielectric layer and then filling the contact holes with conductive material(s). However, it is a tough task to etching the contact holes above the gates and the sources/drains to align with the gates and the sources/drains which are all very small. Also, the gates and the sources/drains are different in height, so that the contact holes thereon are different in etching depth, which also impose obstacles in forming the contact holes.

The technology disclosed herein is directed at least partially to those problems as describe above.

First Embodiment

Next, a first embodiment is described with reference to FIGS. 9-12.

According to the embodiment, after a pattern of photo resist lines is printed as described above with reference to FIG. 5, a pattern of cuts is not immediately formed using a cut mask. Instead, a gate electrode layer is etched directly using the pattern of lines, so as to form parallel gate lines.

Figure 9A:
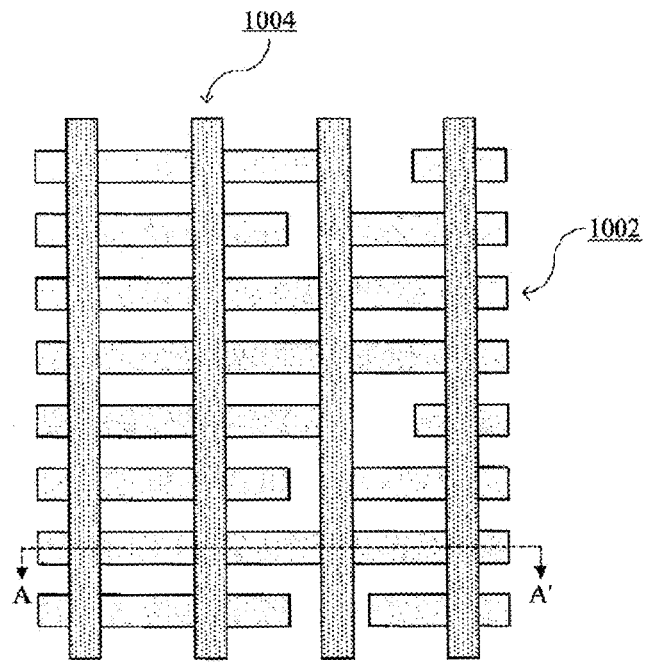
FIG. 9-12 are diagrams schematically showing a process flow for manufacturing a semiconductor device structure according to an embodiment of the present disclosure, wherein (a) is a top view, (b) is a sectional view taken along line A-A' in (a)

Specifically, as shown in FIG. 9, on a SOI substrate (including two Si layers 1000 and 1002 and a SiO$_2$ layer 1001 interposed therebetween), fins 1002 are formed, and then a gate dielectric layer 1003 and a gate electrode layer 1004 are sequentially formed. Next, a pattern of photo resist lines corresponding to a pattern of gate lines to be formed is printed. The respective lines in the pattern of photo resist lines are printed in parallel in a single direction (referring to the above descriptions in conjunction with FIG. 5). Those parallel lines may have different pitches and/or different widths.

Figure 9B:
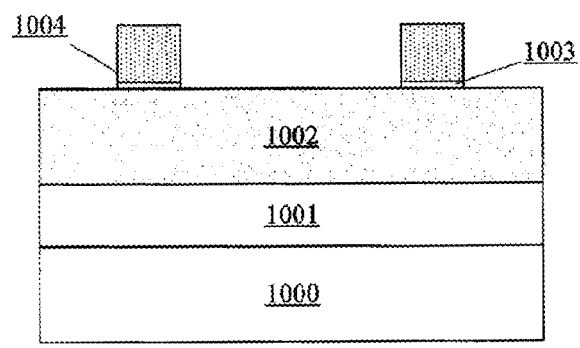

After the pattern of lines is formed, a pattern of cuts is not immediately formed using a cut mask. Instead, the gate electrode layer is etched directly using the pattern of lines, so as to form parallel gate lines 1004. Here, the gate dielectric layer 1003 is also etched, so that only potions of the gate dielectric layer 1003 underneath the gate lines 1004 are remained, as shown in FIG. 9(b).

The gate dielectric layer 1003 may comprise, for example, ordinary dielectric materials such as SiO$_2$, high-K dielectric materials such as one or more selected from HfO$_2$, HfSiO, HfSiON, HfTaO, HfTiO, HfZrO, Al$_2$O$_3$, La$_2$O$_3$, ZrO$_2$, and LaAlO, or the like. The gate electrode layer 1004 may comprise, for example, poly silicon, metal materials such as Ti, Co, Ni, Al, and W or any alloy thereof, metal nitride, or the like.

After the gate lines 1004 are formed, conventional processes may be conducted in order to manufacture semiconductor devices such as transistors. For example, processes such as ion implantation (to perform doping so as to form, for example, sources/drains), spacer formation, silicidation, and dual stress liner integration, may be carried out. Here, it is to be noted that those specific processes (for example, ion implantation, silicidation, etc.) for forming the semiconductor devices are not directly relevant to the present disclosure, and thus will not be described in detail here. They may be implemented by conventional processes or by future developed processes, and the present invention is not limited thereto. In the following, only the spacer formation according to an embodiment will be described in detail.

Figure 10A:
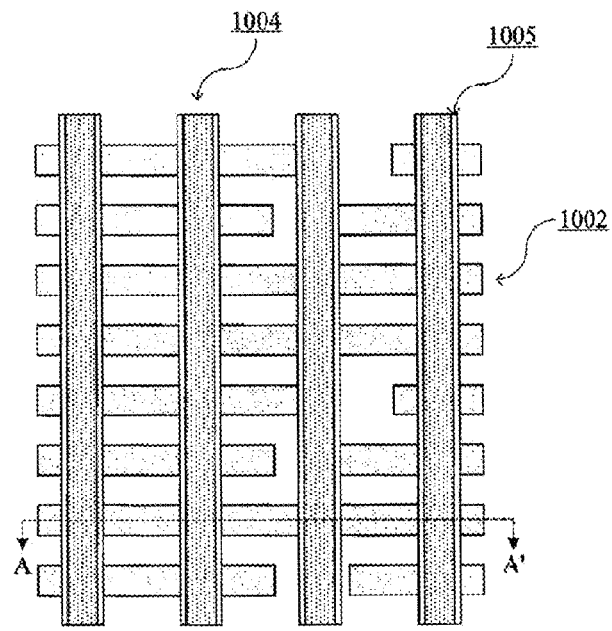
Figure 10B:
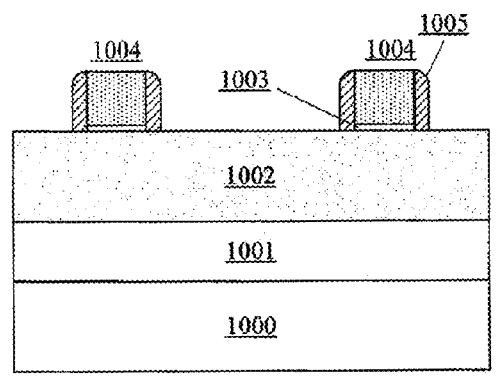

Specifically, as shown in FIG. 10, a dielectric spacer 1005 is formed to surround the respective gate lines 1004. For example, the dielectric spacer 1005 may be formed by depositing on the entire structure one or more layers of dielectric materials, such as SiO$_2$, Si$_3$N$_4$, SiON, and the like, or any combination thereof, and then conducting Reactive Ion Etching (RIE) thereon. Since there is no cut in the gate lines 1004, the dielectric spacer 1005 is formed only on outer sides of the respective gate lines 1004 in the horizontal direction of the figure, except those formed at ends of the gate lines 1004 in the vertical direction. That is, the dielectric spacer 1005 extends along only the outer sides of the respective gate lines 1004.

Further, if the gate dielectric layer is not etched in etching the gate lines, then after the dielectric spacer 1005 is formed, it is possible to carry out etching along the spacer to remove portions of the gate dielectric layer 1003 located outside the spacer.

Figure 11A:
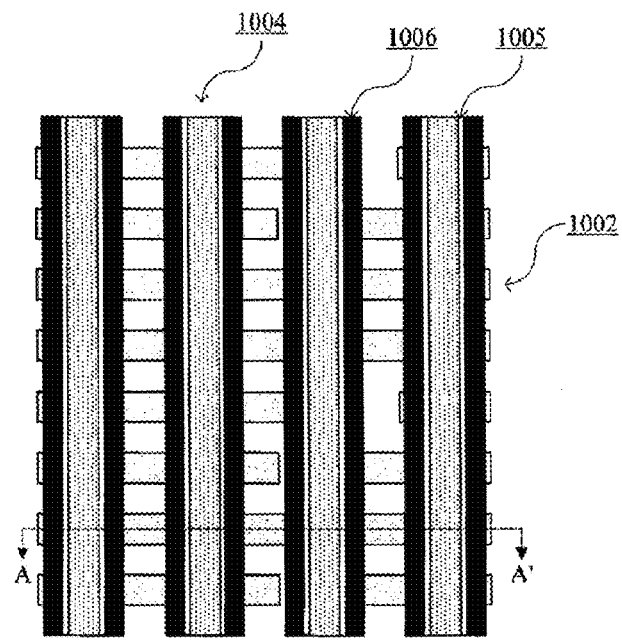
Figure 11B:
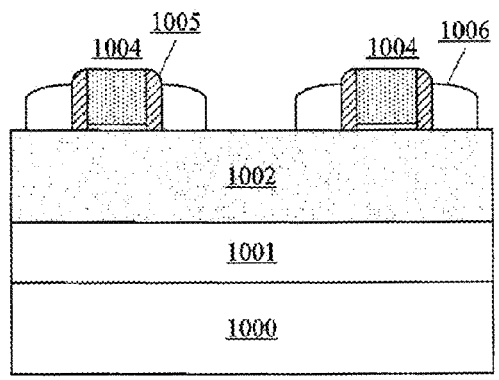

According to an embodiment, in order to form contacts to sources/drains with a high quality, as shown in FIG. 11, a conductive spacer 1006 may be formed with a conductive material to surround the dielectric spacer 1005 described above. Likewise, since there is no cut in the gate lines 1004, the conductive spacer 1006 is formed only on outer sides of the dielectric spacer 1005 in the horizontal direction of the figure, except those formed at the ends of the gate lines 1004 in the vertical direction. Here, the dielectric spacer and the conductive spacer may be formed also on sides of the protruding fins (not shown). In formation of the devices, the dielectric spacer and the conductive spacer on the sides of the protruding fins can be removed based on requirements of the devices.

For example, the conductive spacer 1006 may be made as follows. A conductive material layer, such as metal, metal nitride, carbon, and the like, is conformally deposited on the semiconductor substrate. Then, the deposited conductive material layer is selectively etched to remove portions thereof parallel to the substrate surface, leaving only portions thereof perpendicular to the substrate surface. Thereby, the conductive spacer 1006 is formed. Obviously, those skilled in the art can recognize other ways for manufacturing the conductive spacer 1006 as well as the above described dielectric spacer 1005.

As shown in FIG. 11(*b*), the conductive spacer 1006 is self-aligned on portions of the respective fins on either sides of the respective gate stacks, and thus may serve as contacts for electrical connections between source/drain regions and the outside.

Next, an interlayer dielectric layer 1007 (referring to FIG. 12) may be formed on the resultant structure. Generally, the interlayer dielectric layer may comprise nitride such as $Si_3N_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material.

Figure 12A:
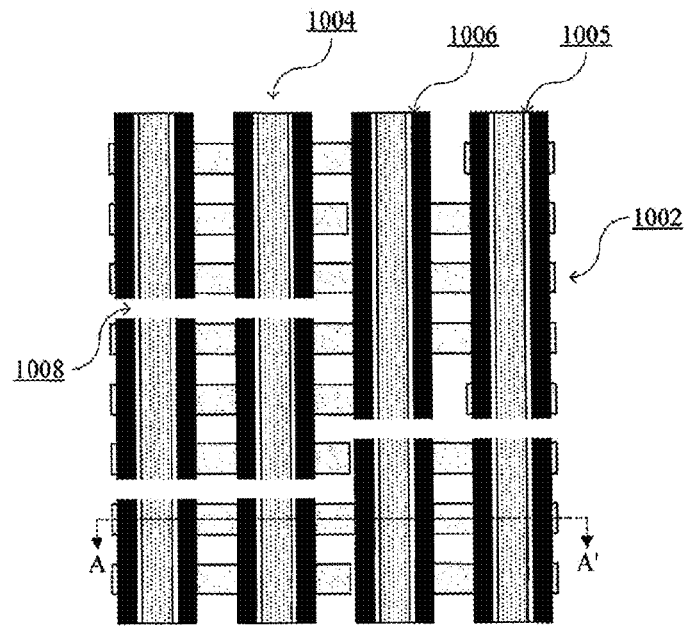
Figure 12B:
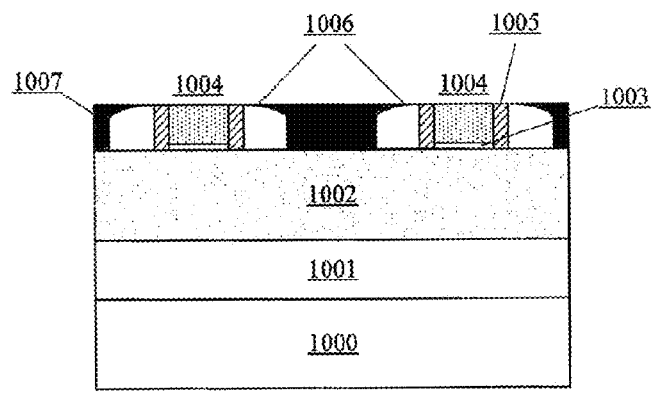

Subsequently, as shown in FIG. 12, the gate lines 1004, together with the dielectric spacer 1005 and the conductive spacer 1006, are cut off at predetermined regions according to the design, to achieve inter-device electrical isolations (in FIG. 12(*a*), the interlayer dielectric layer is not shown for clarity). In general, the cuts are made above fields between the respective fins 1002, with a cut width (in the vertical direction of the figure) of about 1-10 nm. The cutting may be implemented, for example, by RIE, a laser cutting etch, etc. with the use of a cut mask. For instance, if the cutting is done by means of etching, a photo resist layer may be coated on the substrate and then patterned by the cut mask so that the predetermined regions corresponding to the cuts to be formed are exposed. Then, exposed portions of the gate lines 1004 as well as the dielectric spacer 1005 and the conductive spacer 1006 surrounding the respective gate lines are cut off, so as to form the cuts 1008. As a result, the cut gate lines 1004 result in electrically isolated gate electrodes, the cut dielectric spacer results in electrically isolated dielectric spacers, and the cut conductive spacer 1006 results in electrically isolated conductive spacers. The conductive spacers serve as the contact for the respective devices. The cuts 1008 may be filled with a further interlayer dielectric layer subsequently.

Here, it is to be noted that it is also possible not to cut off the dielectric spacer 1005 in the above cutting process, because the dielectric spacer 1005 is insulating and thus will not impact the inter-device electrical isolations. For example, in the example where the cutting is implemented by means of RIE, the etching may be selectively conducted so that the etching does not impact the dielectric spacer 1005 substantially.

Alternatively, in the above process, instead of cutting, oxygen species may be implanted into the cut positions so that the semiconductor material (for example, Si) of the gate lines 1004 and the conductive material (for example, metal) of the conductive spacer 1006 at the predetermined regions are subjected to oxidation and thus are converted to insulating oxides. As a result, due to the resultant oxides, portions of a respective gate line 1004 on opposing sides of a cut position are electrically isolated from each other (which has an effect equivalent to the cutting) to form electrically isolated gate electrodes, and portions of the conductive spacer 1006 on opposing sides of a cut position are electrically isolated from each other (which has an effect equivalent to the cutting) to form electrically isolated conductive spacers, that is, electrically isolated contacts. Of course, the implanted species is not limited to oxygen. Those skilled in the art can select appropriate implantation species based on the materials used for the gate lines 1004 and the conductive spacer 1006 so that they can react to generate dielectric materials and thus achieve the electrical isolations.

Thus, the fabrication of the semiconductor device structure according to this disclosure is substantially finished.

In the above embodiment, the interlayer dielectric layer 1007 is formed before the "cutting" or "isolation" of the gate lines and the conductive spacer (and optionally, also the dielectric spacer). In this case, the cuts can be filed with a further interlayer dielectric layer which is to be formed subsequently. However, it is also possible to perform the "cutting" or "isolation" of the gate lines and the conductive spacer (and optionally, also the dielectric spacer) before the formation of the interlayer dielectric layer 1007. In this case, the cuts will be filled with the interlayer dielectric layer 1007.

FIG. 12(*b*) is a sectional view showing a semiconductor device structure manufactured according to the above described method. In FIG. 12(*b*), the shown structure has already been subjected to planarization such as Chemical Mechanical Polishing (CMP) to expose top sides of the gate electrodes 1004, the dielectric spacers 1005 and the conductive spacers 1006. As a result, the gate stacks (including the gate electrodes 1004 and the dielectric spacers 1005) are substantially flush with the contacts, which will facilitate the subsequent processes such as electrical connection. The planarization process may be carried out immediately after the formation of the interlayer dielectric layer 1007, or may be carried out after the "cutting" or "isolation".

As shown in FIG. 12, the semiconductor device structure comprises a plurality of unit devices. Each of the unit devices may comprise: the fin 1002 formed on the semiconductor substrate and extending in a first direction (the horizontal direction in the figure); the gate electrode 1004 extending in a second direction (the vertical direction in the figure) crossing the first direction, the gate electrode 1004 intersecting the fin 1002 via the gate dielectric layer 1003; the dielectric spacers 1005 formed on the outer sides of the gate electrode; and the conductive spacers 1006 abutting against the outer sides of the dielectric spacers 1005, and serving as contacts for this unit device. Here, the first direction and the second direction may be orthogonal to each other. In this structure, opposing gate electrodes, dielectric spacers and conductive spacers of respective unit devices neighboring in the second direction are made from one same gate line, one same dielectric spacer, and one same conductive spacer extending in the second direction, respectively. The gate line comprises a first isolation at the predetermined region, and the conductive spacer comprises a second isolation at the predetermined region, so that the neighboring unit devices are electrically isolated. The second isolation in the conductive spacer may be the same as the first isolation in the gate line. The isolations may comprise the cuts formed by means of etching, or the insulating materials converted from the gate line and the conductive spacer (for example, the oxides formed by implanting oxygen into the cut positions as described above). The cuts may have dielectric material(s) filled therein. For example, in a case where the interlayer dielectric layer 1007 is formed after the cutting, the cuts may have the material of the interlayer dielectric layer 1007 filled therein. Or alternatively, in a case where the interlayer dielectric layer 1007 is formed before the cutting, the cuts may have the material of a subsequently formed interlayer dielectric layer filled therein.

In the present disclosure, the spacers (the dielectric spacer and the conductive spacer) extend along the outer sides of the respective gate lines, so that at the predetermined regions there will be no materials of the (dielectric and conductive) spacers existing between opposing end faces of the gate electrodes, unlike the conventional art where the spacers surround the gate electrodes so that there will be the materials of the spacers between opposing end faces of the gate electrodes.

Second Embodiment

The disclosed method is also compatible with the replacement gate process. Hereinafter, a second embodiment is described with reference to FIGS. 13-16, where the replacement gate process is incorporated. That is, a sacrificial gate line is first formed, and then is replaced with a replacement gate line.

In the following, emphasis is given to the differences of the second embodiment from the first embodiment and descriptions of the same processes are omitted. Like reference numbers denote like parts throughout the drawings.

Figure 13A:
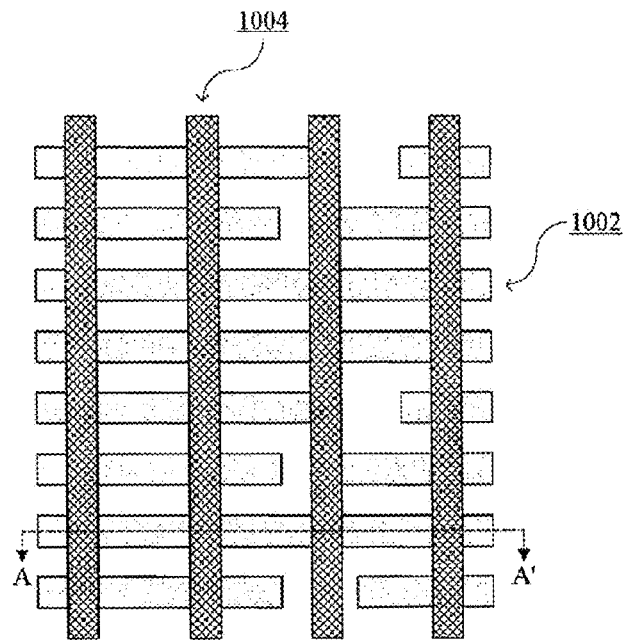
FIGS. 13-16 are diagrams schematically showing a process flow for manufacturing a semiconductor device structure according to a further embodiment of the present disclosure, wherein (a) is a top view, (b) is a sectional view taken along line A-A' in (a).
Figure 13B:
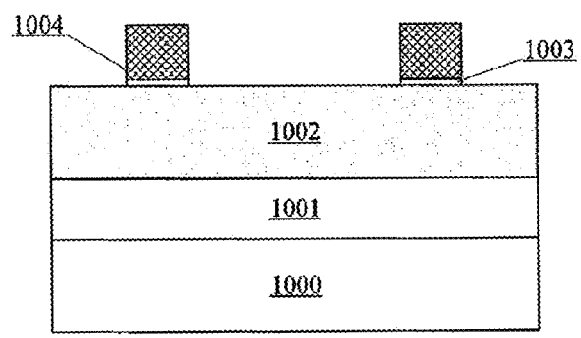

As shown in FIG. 13, after fins 1002 are formed and then a sacrificial gate dielectric layer 1003 and a sacrificial gate electrode layer 1004 are sequentially deposited on a semiconductor substrate, sacrificial gate lines 1004 are formed by printing a pattern of parallel gate lines and then carrying out etching, like the first embodiment. Usually, the sacrificial gate lines 1004 are made of poly silicon.

Figure 14A:
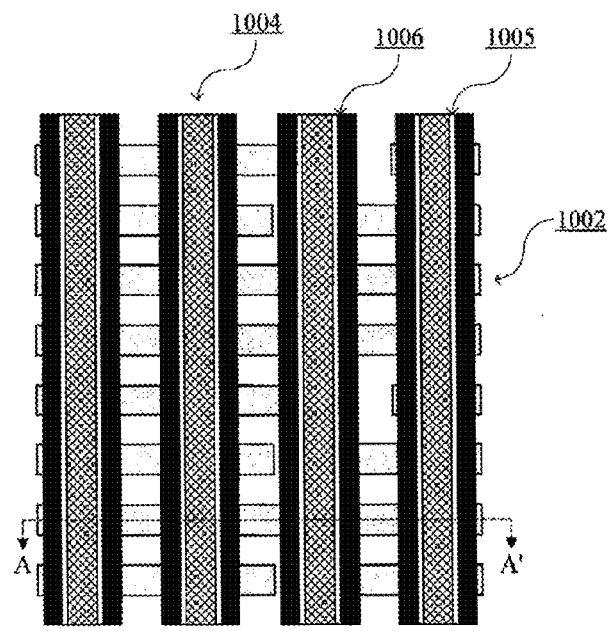
Figure 14B:
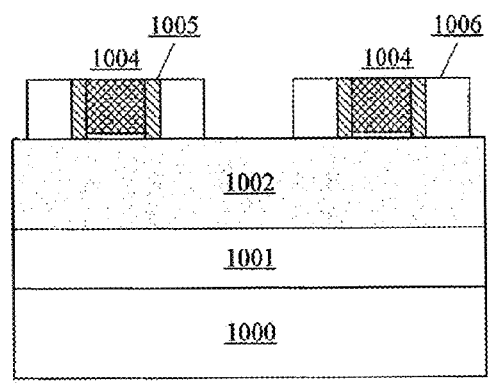

Then, the process continues as in the first embodiment. For example, as shown in FIG. 14, a dielectric spacer 1005 may be formed to surround the respective sacrificial gate lines 1004. Since there is no cut in the gate lines 1004, the dielectric spacer 1005 is formed on outer sides of the respective sacrificial gate lines 1004 in the horizontal direction of the figure, except those formed at ends of the sacrificial gate lines 1004 in the vertical direction. Further, a conductive spacer 1006 may be formed to abut against outer sides of the dielectric spacer 1005. As describe above, the conductive spacer 1006 may serve as contacts for electrical connections between source/drain regions and the outside. Next, an interlayer dielectric layer 1007 (referring to FIG. 12, but not shown here) may be formed on the resultant structure. Generally, the interlayer dielectric layer may comprise nitride such as $Si_3N_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material.

Figure 15A:
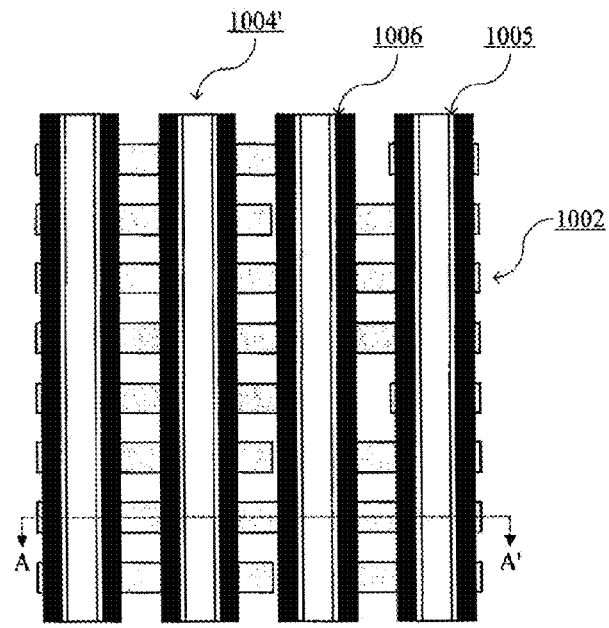
Figure 15B:
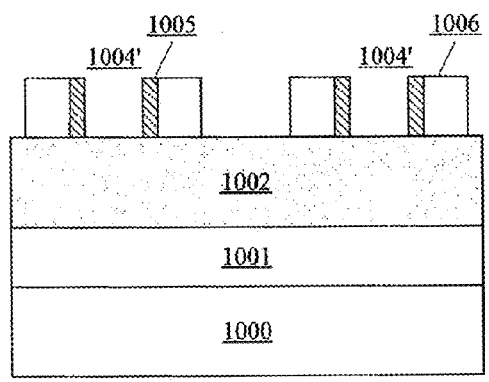
Figure 16A:
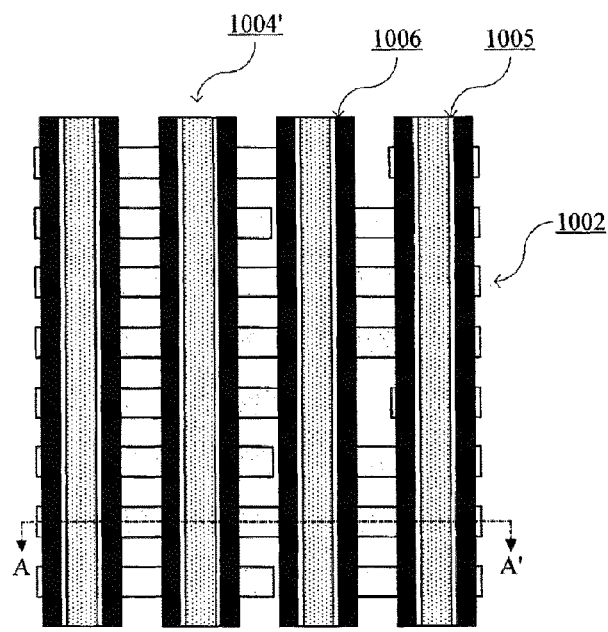
Figure 16B:
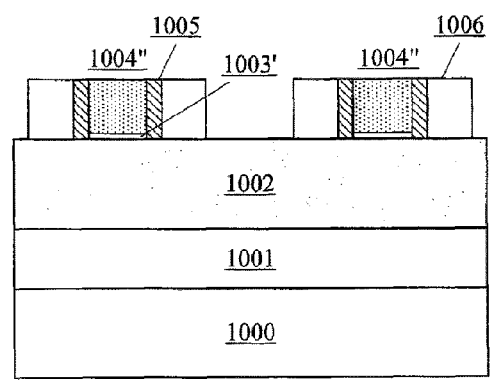

Subsequently, as shown in FIG. 15, the sacrificial gate lines 1004 and the sacrificial gate dielectric layer 1003 are removed by means of, for example, etching or the like, resulting in openings 1004' inside the dielectric spacer 1005. Then, as shown in FIG. 16, a replacement gate dielectric layer 1003' (for example, a high-K gate dielectric layer) and replacement gate lines 1004" (for example, metal gate lines) are formed in the openings 1004'. Those skilled in the art can devise various ways to implement the replacement process for the gate lines.

Optionally, a planarization process such as CMP may be performed after the formation of the replacement gate lines 1004", so as to make the replacement gate lines 1004" have the same height as the conductive spacer 1006, which will facilitate the subsequent processes.

Next, electrical isolations between unit devices are made at predetermined regions by means of a cut mask, like the first embodiment (referring to FIG. 12). Specifically, the electrical isolations can be made by cutting off the replacement gate lines 1004" and the conductive spacer 1006, and optionally, also the dielectric spacer 1005, at the predetermined regions. Or alternatively, the electrical isolations can be made by implanting oxygen species into the predetermined regions so that the material (for example, metal gate material) of the replacement gate lines 1004" and the conductive material (for example, metal) of the conductive spacer 1006 are subjected to oxidation to form insulating oxides.

Here, it should be noted that, although the replacement gate process is conducted before the cutting process in the above described embodiment, the present disclosure is not limited thereto. It is also feasible to conduct the cutting process before the replacement gate process. For example, the isolation process may be performed immediately after the conductive spacer 1006 is formed so as to form the electrically isolated gate electrodes and the electrically isolated contacts, and then the replacement gate process is conducted to form the replacement gates. In a word, the sequences of the steps in various embodiments are not limited to those described above.

According to embodiments of the present disclosure, the electrical isolations (for example, cutting or oxidation) between the unit devices can be made anytime after the conductive spacer is formed, so as to finally complete the front end of line (FEOL) process for the semiconductor device structure. In other words, the isolation process may be performed after the formation of the conductive spacer and before the completion of metal interconnections for the semiconductor device structure.

In the second embodiment, the dielectric spacer and the conductive spacer are both formed as "I" shaped spacers, which are different from the "D" shaped spacers in the first embodiment. The "I" shaped spacers have a benefit that they have the same height as the gate stacks so that the planarization process may be omitted. Those skilled in the art know various ways to form the "I" shaped spacers, and thus detailed descriptions thereof are omitted here. Also, the "I" shaped spacers are applicable to the first embodiment.

As described above, in the embodiments of the present disclosure, the pattern of parallel lines will not be subjected to the inter-device electrical isolation process by means of the cut mask immediately after being printed on the substrate, unlike the conventional processes. Instead, etching is performed directly using the pattern of parallel lines to form the gate lines. Subsequently, the processes for forming the semiconductor device structure are performed. Finally, the inter-device electrical isolations are made using the cut mask by means of, for example, cutting, oxidation, or the like. Therefore, according to the disclosed technology, the gate patterns are cut off or isolated at a later stage so that the ends of a pair of opposing gates can be closer to each other.

Optionally, before cutting off the gate lines, the conductive spacer may be formed on the outer sides of the respective gate lines, resulting in the contacts to the sources/drains in a self-aligned manner in a form of spacer.

Further, in the present disclosure, the isolation process is conducted to isolate the devices from one another after the formation of the dielectric spacer and the conductive spacer. Therefore, there will be no spacer materials remained between the ends of the opposing unit devices, and there will be no defects such as voids, unlike the conventional processes. In addition, the conductive spacers (that is, the contacts) for the respective unit devices are entirely isolated from one another by the cuts or the isolations, and thus it is possible to achieve good electrical isolation between the devices.

Further, unlike the conventional processes where contacts are formed by etching contact holes and then filling the contact holes with conductive material(s), according to embodiments of the disclosure, the contacts are formed in a form of spacer, thus eliminating the difficulty in forming the contact holes in the conventional processes. Also, such contacts in a form of spacer are self-aligned on the source/drain regions, and therefore the process is dramatically simplified. At the same time, it is impossible to form such self-aligned contacts in a form of conductive spacer according to the conventional processes. This is because in the conventional processes, the spacer formation process is conducted after the cuts are formed. In this case, during the formation of the spacers, especially, during the forming of the conductive spacers, conductive materials may enter into the cuts. This will possibly cause the respective conductive spacers of a pair of opposing gates not completely isolated from each other, and thus the corresponding devices will electrically contact with each other.

Furthermore, the present disclosure is compatible with the replacement gate process. Thus, it is possible to have various options for processes.

Moreover, in the present disclosure, the conductive spacers (that is, the contacts) and the gate stacks may be made to have the same height by, for example, the planarization process. This facilitates the subsequent processes.

The mere fact that benefic measures described above in the different embodiments is not intended to mean that those measures cannot be used in combination to advantage.

In the above descriptions, details of patterning and etching of the layers are not described. It is understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A method for manufacturing a semiconductor device structure, comprising:
    forming a fin in a first direction on a semiconductor substrate;
    forming a gate line in a second direction crossing the first direction on the semiconductor substrate, the gate line intersecting the fin via a gate dielectric layer;
    forming a dielectric spacer surrounding the gate line;
    forming a conductive spacer surrounding the dielectric spacer; and
    performing inter-device electrical isolation at a predetermined region in such a manner that the gate line is divided into portions for respective unit devices and the conductive spacer is divided into portions for the respective unit devices, wherein the portions of the gate line, which are isolated from each other by the inter-device electrical isolation, form gate electrodes of the respective unit devices, and the portions of the conductive spacer, which are isolated from each other by the inter-device electrical isolation, form contacts of the respective unit devices.

2. The method according to claim 1, wherein performing inter-device electrical isolation comprises cutting off the gate line and the conductive spacer at the predetermined region.

3. The method according to claim 2, wherein the method further comprises cutting off the dielectric spacer at the predetermined region.

4. The method according to claim 1, wherein performing inter-device electrical isolation comprises converting portions of both the gate line and the conductive spacer at the predetermined region into insulating materials.

5. The method according to claim 4, wherein performing inter-device electrical isolation comprises implanting oxygen into the predetermined region and converting the portions of both the gate line and the conductive spacer at the predetermined region into oxides.

6. The method according to claim 1, wherein the inter-device electrical isolation is performed after the conductive spacer is formed and before metal interconnections of the semiconductor device structure are completed.

7. The method according to claim 1, wherein before the electrical isolation is performed, the method further comprises:
    performing planarization to expose top surfaces of the gate line, the dielectric spacer and the conductive spacer.

8. The method according to claim 1, wherein after the conductive spacer is formed and before the inter-device electrical isolation is performed, the method further comprises:
    removing the gate line to form an opening inside the dielectric spacer; and
    forming a replacement gate line in the opening.

9. A semiconductor device structure, comprising:
    a semiconductor substrate;
    a plurality of unit devices formed on the semiconductor substrate, each of the unit devices comprising:
        a fin extending in a first direction;
        a gate electrode extending in a second direction crossing the first direction, the gate electrode intersecting the fin via a gate dielectric layer;
        dielectric spacers formed on outer sides of the gate electrode; and
        conductive spacers formed on outer side of the dielectric spacers, the conductive spacers serving as contacts for the unit device,
    wherein gate electrodes, dielectric spacers and conductive spacers of respective unit devices adjacent to each other in the second direction are made from one gate line, one dielectric spacer, and one conductive spacer, respectively,
    the one gate line comprises a first electrical isolation at a predetermined region between the adjacent unit devices, the first electric isolation isolates the gate electrodes of the adjacent unit devices from each other,
    the one conductive spacer comprises a second electrical isolation at the predetermined region between the adjacent unit devices, the second electrical isolation isolates the conductive spacers of the adjacent unit devices from each other, and
    the one dielectric spacer only extends along the outer sides of the one gate line.

10. The semiconductor device structure according to claim 9, wherein the first and second electrical isolations comprise cuts in the one gate line and in the one conductive spacer, respectively, at the predetermined region, wherein the cuts are filled with a dielectric material.

11. The semiconductor device structure according to claim 10, wherein the cuts further extend through the one dielectric spacer.

12. The semiconductor device structure according to claim 9, wherein the first electrical isolation comprises an insulating material converted from a portion of the one gate line at the predetermined region.

13. The semiconductor device structure according to claim 9, wherein the second electrical isolation comprises an insulating material converted from a portion of the one conductive spacer at the predetermined region.

14. The semiconductor device structure according to claim 12, wherein the insulating material comprises oxide.

15. The semiconductor device structure according to claim 9, wherein top surfaces of the gate electrodes, the dielectric spacers and the conductive spacers of the respective unit devices are flushed with each other.

16. The semiconductor device structure according to claim 9, wherein the unit device comprises a Fin Field Effect Transistor.

17. The semiconductor device structure according to claim 13, wherein the insulating material comprises oxide.

* * * * *